(12) United States Patent
Yamaguchi

(10) Patent No.: US 7,688,664 B2
(45) Date of Patent: Mar. 30, 2010

(54) ELECTRICAL FUSE CIRCUIT, MEMORY DEVICE AND ELECTRONIC PART

(75) Inventor: Shusaku Yamaguchi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 189 days.

(21) Appl. No.: 11/889,673

(22) Filed: Aug. 15, 2007

(65) Prior Publication Data

US 2008/0043551 A1    Feb. 21, 2008

(30) Foreign Application Priority Data

Aug. 18, 2006    (JP)    ............................. 2006-223427

(51) Int. Cl.
    G11C 17/18    (2006.01)
(52) U.S. Cl. ...................... 365/225.7; 365/149; 365/96; 365/203
(58) Field of Classification Search .............. 365/225.7, 365/149, 96, 203
    See application file for complete search history.

(56) References Cited

U.S. PATENT DOCUMENTS

| | | | |
|---|---|---|---|
| 6,115,283 A * | 9/2000 | Hidaka ........................ | 365/149 |
| 6,130,834 A | 10/2000 | Mullarkey et al. | |
| 6,144,247 A | 11/2000 | Kim et al. | |
| 6,333,666 B2 | 12/2001 | Kim et al. | |
| 6,346,846 B1 * | 2/2002 | Bertin et al. ................. | 327/525 |
| 2001/0030570 A1 | 10/2001 | Kim et al. | |
| 2002/0051399 A1 | 5/2002 | Tanizaki et al. | |
| 2002/0179943 A1 * | 12/2002 | Shirai et al. ................. | 257/238 |
| 2004/0042317 A1 | 3/2004 | Marr et al. | |
| 2006/0072364 A1 * | 4/2006 | Yoshida et al. ........... | 365/225.7 |
| 2006/0152272 A1 | 7/2006 | Sueoka | |

FOREIGN PATENT DOCUMENTS

| | | |
|---|---|---|
| JP | 9-185897 | 7/1997 |
| JP | 2006-147651 | 6/2006 |
| KR | 2000-0050452 A | 8/2000 |
| KR | 10-0317490 | 12/2001 |
| KR | 10-0359855 B1 | 1/2003 |

* cited by examiner

Primary Examiner—VanThu Nguyen
Assistant Examiner—Eric Wendler
(74) Attorney, Agent, or Firm—Arent Fox LLP

(57) ABSTRACT

An electrical fuse circuit including: a capacitor composing an electrical fuse; a write circuit breaking an insulating film of the capacitor by applying voltage to between both terminals of the capacitor in accordance with a write signal; and a precharge circuit precharging with respect to the terminal of the capacitor, is provided.

14 Claims, 12 Drawing Sheets

F I G. 5
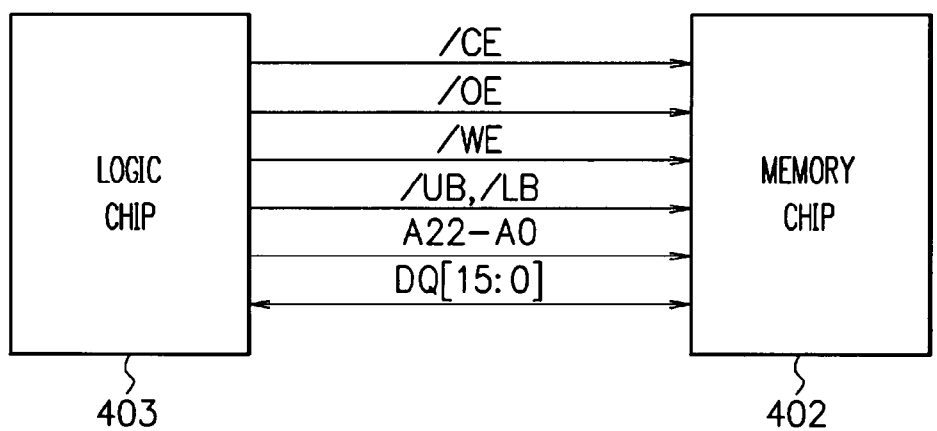
F I G. 6
| CODE NUMBER | FUNCTION | A22-A5 | A4 | A3 | A2 | A1 | A0 |
|---|---|---|---|---|---|---|---|
| 0 | ADDRESS STROBE MODE ENTRY | 0 | 0 | 0 | 0 | 0 | 0 |
| 1 | ADDRESS STROBE MODE EXIT | 0 | 0 | 0 | 0 | 0 | 1 |
| 2 | WRITE EFUSE MODE ENTRY | 0 | 0 | 0 | 0 | 1 | 0 |
| 3 | WRITE EFUSE MODE EXIT | 0 | 0 | 0 | 0 | 1 | 1 |

F I G. 12
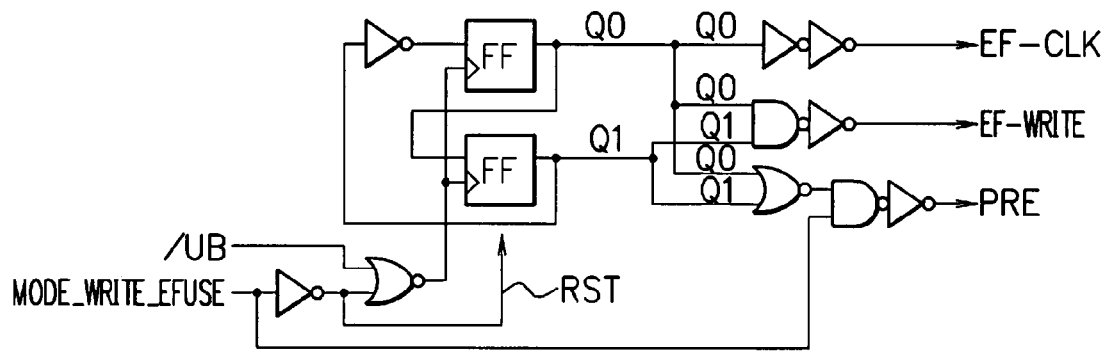
F I G. 13
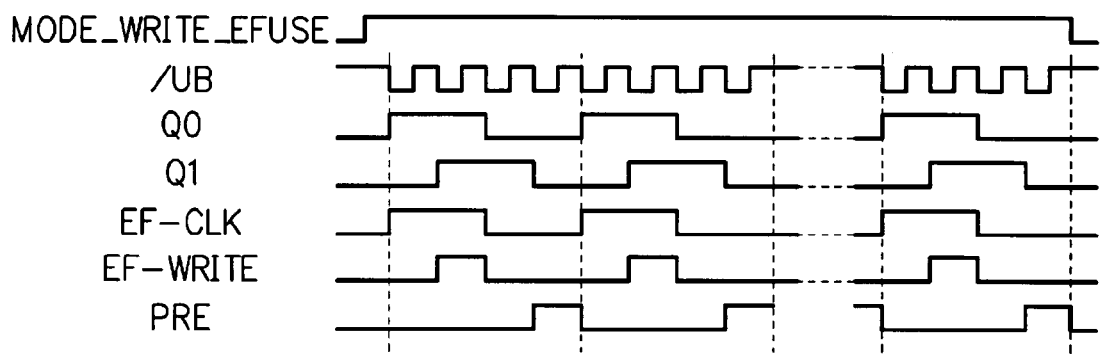

1

ELECTRICAL FUSE CIRCUIT, MEMORY DEVICE AND ELECTRONIC PART

CROSS-REFERENCE TO RELATED APPLICATIONS

This application is based upon and claims the benefit of priority from the prior Japanese Patent Application No. 2006-223427, filed on Aug. 18, 2006, the entire contents of which are incorporated herein by reference.

BACKGROUND OF THE INVENTION

1. Field of the Invention

The present invention relates to an electrical fuse circuit, a memory device and an electronic part.

2. Description of the Related Art

FIG. 16 is a view showing a semiconductor memory chip including a laser fuse. The semiconductor memories in recent years include a redundant memory cell using a laser fuse, in which a defective memory cell is replaced with a redundant memory cell in general. The laser fuse is a nonvolatile ROM cutting a wiring layer with a laser beam to write (for example, in an uncut state, it is in an electrically connected state being "0 (zero)", and in a cut state, it is in an electrically unconnected state being "1"), and the replacement to the redundant memory cell is performed by letting this ROM memorize the address of the defective memory cell. However, after a memory chip 1601 using the laser fuse is packaged in a package 1602, no laser LS is emmittable thereto. It is known as a phenomenon that a DRAM in the memory chip 1601 is degraded in refresh characteristic and the like, affected by heat or the like at the time of the packaging. However, it is impossible to emit the laser LS thereto after the packaging. Therefore, a method, in which an electrically writable electrical fuse is used as a nonvolatile ROM and the ROM is made to memorize the address of the defective memory cell to replace the defective memory cell with the redundant memory cell, is under study.

FIG. 17 is a view showing a configuration example of an electrical fuse circuit. Hereinafter, a field-effect transistor is simply called a transistor. An electrical fuse capacitor 101 is connected to between a voltage VRR and a node n3. An n-channel transistor 102 is a protection transistor connected to a voltage VPP with a gate thereof, to the node n3 with a drain thereof, and to a node n2 with a source thereof. The voltage VPP is for example 3V. An n-channel transistor 103 is a write circuit connected to a write signal WRT with a gate thereof, to the node n2 with a drain thereof, and to a ground with a source thereof.

Subsequently, the description will be given of the configuration of a read circuit 110. An n-channel transistor 111 is connected to a read signal RD with a gate thereof, to the node n2 with a drain thereof, and to a node n4 with a source thereof. An n-channel transistor 113 is connected to a node n5 with a gate thereof, to the node n4 with a drain thereof, and to a ground via a resistance 114 with a source thereof. A p-channel transistor 112 is connected to the node n5 with a gate thereof, to a voltage VII with a source thereof, and to the node n4 with a drain thereof. The voltage VII is for example 1.6 V. A nonconjunction (NAND) circuit 115 is connected to a power supply voltage VII and an input terminal thereof is connected to the node n4 and the line of a signal RSTb, and an output terminal thereof is connected to the node n5. A NOT circuit 116 is connected to the node n5 with an input terminal thereof and to the line of a signal EFA with an output terminal thereof.

FIG. 18 is a view showing a configuration example of an electrical fuse circuit 215 and a peripheral circuit thereof and FIG. 19 is a timing chart showing an example write operation of an electrical fuse circuit. The electrical fuse circuit 215 corresponds to the electrical fuse circuit in FIG. 17. A booster circuit & level control circuit 201 boosts the voltage and controls the level to supply the voltage to a plurality of unit circuits 203. An electrical fuse control circuit 202 outputs the signal RD, the signal RSTb, a signal EF-WRITE, a signal EF-START, a signal EF-CLK, a signal EF-STRB to the plurality of unit circuits 203. Each of the unit circuits 203 includes flip-flops (FFs) 211, 212, a NAND circuit 213, and a NOT circuit 214 and an electrical fuse circuit 215. The flip-flops 211 in the plurality of unit circuits 203 input address signals A0 (zero) to A2 and a valid signal VALID and compose address resistors 204, respectively. For convenience's purpose of description, the case of 3-bit address signals A0 (zero) to A2 is described as an example. The valid signal VALID is a signal indicating whether or not to validate memorized contents of the electrical fuses corresponding to the address signals A0 (zero) to A2. For instance, when no defective memory cell exists and no replacement to the redundant memory cell is required, just make the valid signal VALID to low level. The flip-flops 212 in the plurality of unit circuits 203 compose shift resistors 205.

Before a time t1, the pulse of the signal EF-STRB is inputted into clock terminals of the flip-flops 211 and the address signals A0 (zero) to A22 are inputted into the input terminals of the flip-flops 211, respectively.

The description will be given of a writing example in the case where the signals such as the address signal A0 (zero) at low level, the address signal A1 at high level, the address signal A2 at low level, and the valid signal VALID at high level, as an example, are written into the electrical fuse. The register 211 of the address signal A0 (zero) outputs low level. The register 211 of the address signal A1 outputs high level. The register 211 of the address signal A2 outputs low level. The register 211 of the valid signal VALID outputs high level.

At and after the time t1, a clock signal CLK becomes a clock pulse having a constant frequency. The signal EF-WRITE is a pulse having the same cycle as of the clock EF-CLK. At the time t1, the start signal EF-START is turned from high level into low level. Then, the shift resister 212 shifts the start signal EF-START to output it to the next shift register 212. With this, the resister 212 of the address signal A0 (zero), the resister 212 of the address signal A1, the resister 212 of the address signal A2 and the resister 212 of the valid signal VALID output the shifted pulse, respectively.

After the time t1, the NOT circuit 214 of the address signal A0 (zero) keeps low level to output no pulse as a write signal WRT. After the time t2, the NOT circuit 214 of the address signal A1 outputs a high-level pulse as a write signal WRT. After the time t3, the NOT circuit 214 of the address signal A2 keeps low level to output no pulse as a write signal WRT. After the time t4, the NOT circuit 214 of the valid signal VALID outputs a high-level pulse as a write signal WRT.

In FIG. 17, when the write signal WRT becomes high level, the transistor 103 is turned on. The high voltage VRR (for example, 8V) is applied to the capacitor 101. The electrical fuse is composed of the capacitor 101, and is in the electrically unconnected state when nothing is done. When the high voltage (for example, 8V) is applied to both the terminals of the capacitor 101, an insulating film of the capacitor 103 is broken so that the capacitor is put into the electrically connected state. These two states are assigned to data 0 (zero) and data 1, respectively. For example, when it is in the electrically unconnected state where the insulating film of the capacitor is not broken, "0 (zero)" is assigned, and when it is in the electrically connected state where the insulating film of the capacitor is broken, "1" is assigned. The capacitor 101 can be used as a nonvolatile ROM.

The high voltage required to perform a breaking operation of the insulating film of the electrical fuse (hereinafter called the "write operation") is generated by the booster circuit 201 provided in the semiconductor chip. Further, when trying to write into the plurality of capacitors 101 at a time as a write operation, huge current may flow, so that the writing is performed to the capacitors on the one by one basis by providing the shift registers 205.

The description will be given of the write operation into the capacitor (electrical fuse) 101. First, the booster circuit 201 boosts the voltage VRR at the common node of the plurality of capacitors 101 to high voltage (for example, 8V). At this time, the other terminal node n3 of the capacitor is in the floating state, so that the potential of the node n3 increase as well. In this state, the difference between the potentials of both the terminals of the capacitor 101 is still small. After that, the transistor 103 into which the write signal WRT selected by the shift resistor 205 is written is turn on and the high voltage is applied to between both the terminals of the capacitor 101 using the node n3 as a ground to break the insulating film of the capacitor 101. At this time, in the capacitor 101 corresponding to the unselected write signal WRT, the node n3 is still in the floating state, so that the high voltage is not applied to between both the terminals of the unselected capacitor 101. Should the high voltage be applied, the insulating film of the capacitor into which the writing is not intended to be performed actually, will be broken.

FIG. 20 is a timing chart of the semiconductor memory chip including the electrical fuse circuit when the power supply starts. A power supply voltage VDD is the power supply voltage for the semiconductor memory chip, and is for example 1.8 V. With the power supply starting, the voltages VDD, VRR and RC increase gradually. After a while, the voltage VRR keeps around 1.6 V. The signal RSTb keeps low level. In FIG. 17, when the signal RSTb is low level, the node n5 becomes high level. Then, the transistor 112 is turned off and the transistor 113 is turned on. As a result, the node n4 turns from the floating state into low level. After that, the signal RSTb turns from low level into high level. When the capacitor 101 is in the connected state, the node n4 becomes high level and the output signal EFA becomes high level. Meanwhile, when the capacitor 101 is in the unconnected state, the node n4 becomes low level and the output signal EFA becomes low level. After that, the voltage VRR and the read signal RD becomes the ground, the transistor 111 turns off, and the output signal EFA is kept. Based on the above operation, the read circuit 110 outputs the state of the capacitor 101 as a signal EFA.

In Japanese Patent Application Laid-Open No. 2006-147651 (Patent document 1), there is described a semiconductor integrated circuit, in which, a fuse metal being unconnected by being applied Vdd to one end portion thereof and at the same time by being applied a laser beam is provided above a semiconductor substrate with the other end portion thereof being provided on the substrate, and the fuse metal is electrically connected to a drain of an N-channel transistor for programming being applied Vss as a back bias.

Also, in Japanese Patent Application Laid-Open No. Hei9-185897 (Patent document 2), there is described a redundant fuse circuit including: a node determining a logic state of a redundant addressing signal, a fuse provided in parallel with the node, and a precharge circuit precharging the node in accordance with a clock.

FIG. 21 is a timing chart showing an example writing malfunction of a fuse circuit, which corresponds to FIG. 19. The description of the same signals as in FIG. 19 will be omitted here. In the voltage VRR, a pulse of 8V is generated at the same cycle as of the signal EF-WRITE. When the write operation writing into the plurality of capacitors (electrical fuses) 101 on the one by one basis is repeated, the potential of the node n3 in the unselected electrical fuse circuit downs gradually due to a junction leakage or the like. When the number of the entire bits of the electrical fuse is large, a high voltage 2101 is caused to be applied to both the ends of the capacitor 101 of the unselected electrical fuse, and thereby the writing is caused to be performed into the capacitor which is not intended to be written actually, leaving a problem.

SUMMARY OF THE INVENTION

An object of the present invention is to provide an electrical fuse circuit, a memory device and an electronic part capable of preventing a writing malfunction into an electrical fuse.

According to an aspect of the present invention, an electrical fuse circuit includes: a capacitor composing an electrical fuse; a write circuit breaking an insulating film of the capacitor by applying an electric voltage to between both terminals of the capacitor in accordance with a write signal; and a precharge circuit precharging with respect to the terminal of the capacitor, is provided.

BRIEF DESCRIPTION OF THE DRAWINGS

FIG. 5 is a view showing connection lines between a logic chip and a memory chip;

FIG. 6 is a view showing example codes of the electrical fuse operation outputted from the memory controller in the logic chip to the memory chip;

FIG. 12 is a circuit diagram showing a configuration example of the electrical fuse control circuit connected to FIG. 9;

FIG. 13 is a timing chart showing an example operation of the circuit in FIG. 12;

DETAILED DESCRIPTION OF THE PREFERRED EMBODIMENTS

Figure 15:
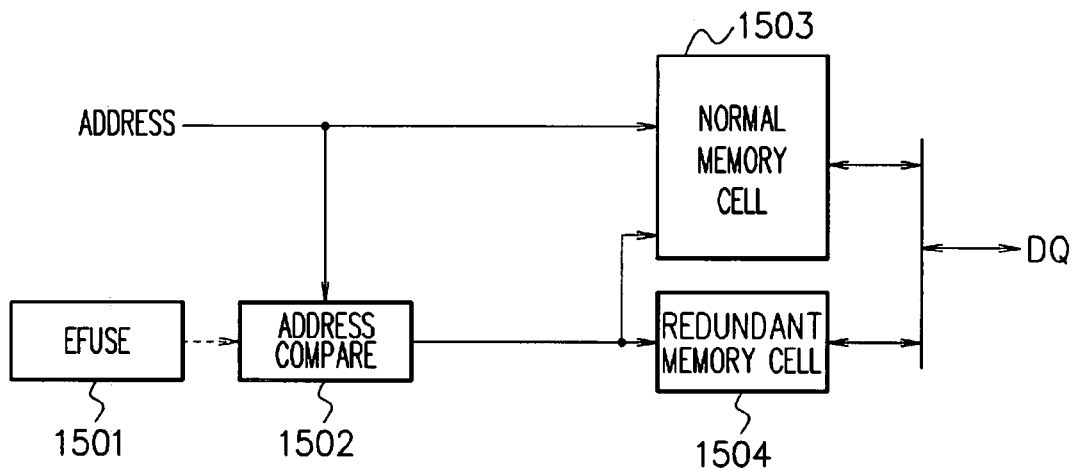
FIG. 15 is a view showing a configuration example of a semiconductor memory chip.
Figure 16:
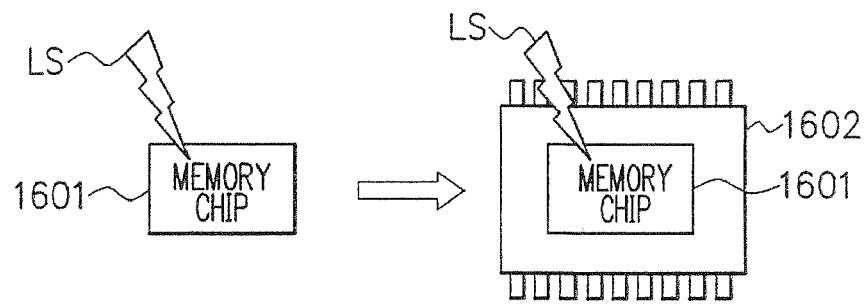
FIG. 16 is a view showing a semiconductor memory chip including a laser fuse.

FIG. 15 is a view showing a configuration example of a semiconductor memory chip according to an embodiment of the present invention. An electrical fuse circuit 1501 is a nonvolatile ROM memorizing an address of a defective memory cell in a normal memory cell array 1503 to output the address of the defective memory cell to an address comparator 1502. The address comparator 1502 compares the address of the defective memory cell and the inputted address to output the comparison result of both the addresses to the normal memory cell array 1503 and a redundant memory cell array 1504. When both the addresses are unmatched, the normal memory cell array 1503 reads or writes a data DQ with respect to the memory cell corresponding to the inputted address. When both the addresses are matched, the redundant memory cell array 1504 reads or writes the data DQ with respect to the memory cell corresponding to the inputted address. With this, when there is any defective memory cell in the normal memory cell array 1503, the defective memory cell can be replaced with the memory cell in the redundant memory cell array 1504.

Figure 1:
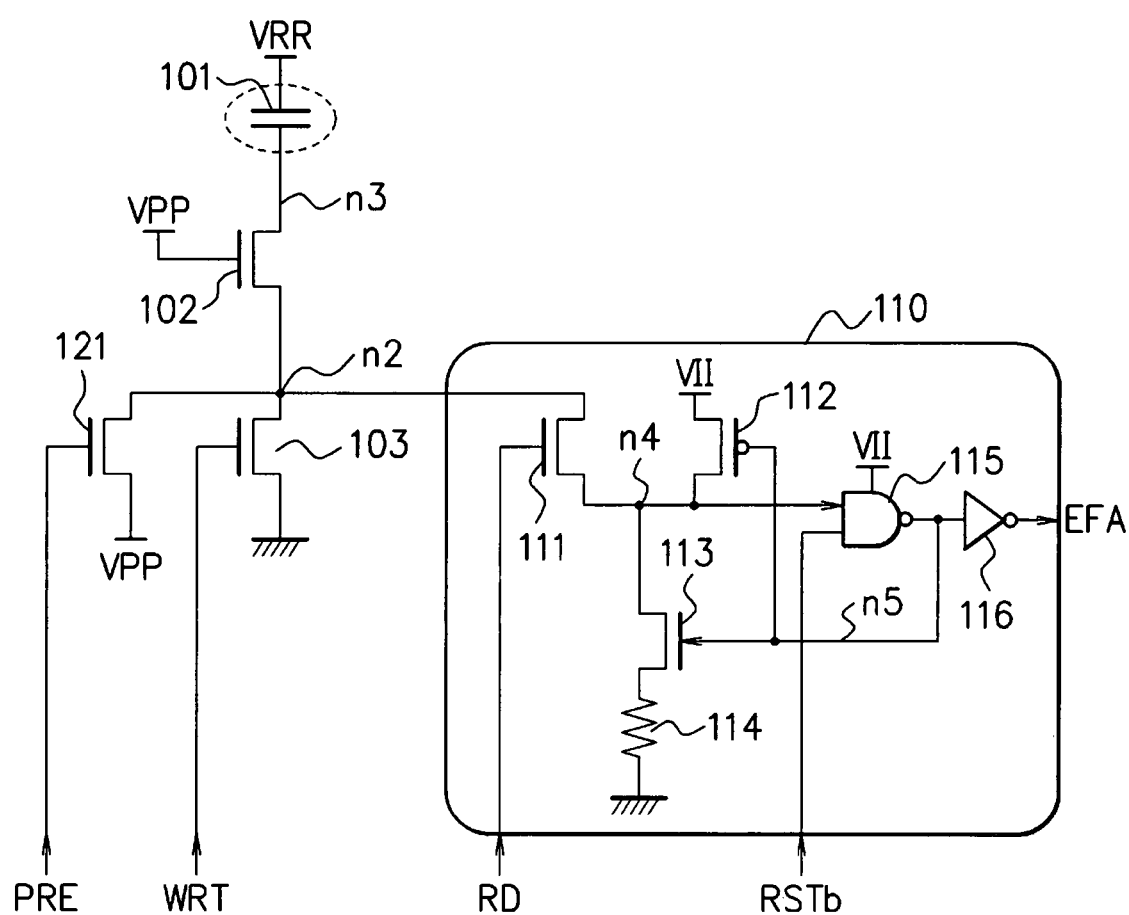
FIG. 1 is a view showing a configuration example of an electrical fuse circuit according to an embodiment of the present invention.
Figure 17:
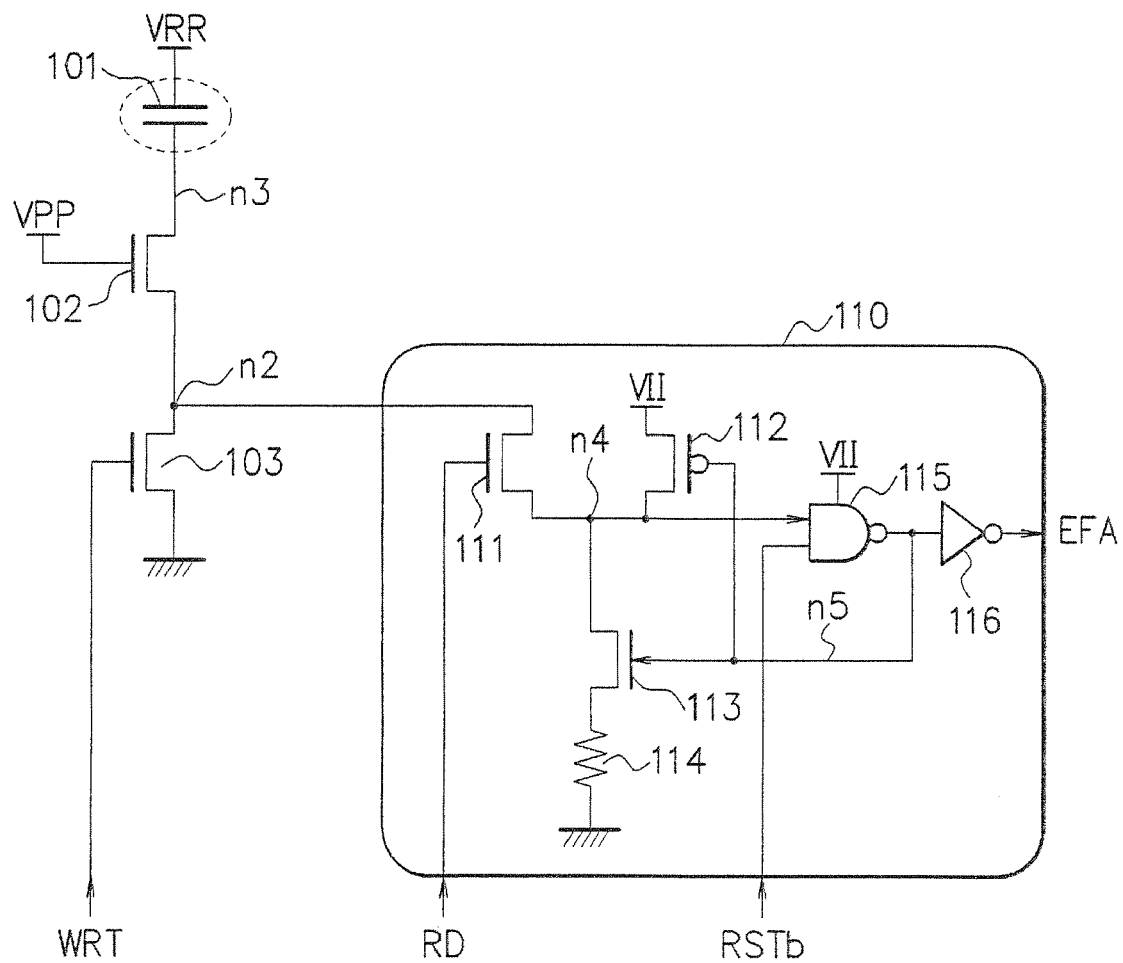
FIG. 17 is a view showing a configuration example of the electrical fuse circuit.

FIG. 1 is a view showing a configuration example of the electrical fuse circuit 1501 according to the present embodiment. In FIG. 1, an n-channel field-effect transistor 121 is provided in addition to FIG. 17. Hereinafter, a field-effect transistor is simply called a transistor. A capacitor 101 is connected to between a voltage VRR and a node n3 to compose an electrical fuse. An n-channel transistor 102 is a protection transistor connected to a voltage VPP with a gate thereof, to the node n3 with a drain thereof, and to a node n2 with a source thereof. The voltage VPP is for example 3V. An n-channel transistor 103 is a write circuit connected to a write signal WRT with a gate thereof, to the node n2 with a drain thereof, and to a ground (reference potential) with a source thereof. The n-channel transistor 121 is a precharge circuit connected to a precharge signal PRE with a gate thereof, to the node n2 with a drain thereof, and to a ground with a source thereof. The voltage VPP is for example 3V.

Subsequently, the description will be given of a configuration of a read circuit 110. An n-channel transistor 111 is connected to a read signal RD with a gate thereof, to the node n2 with a drain thereof, and to a node n4 with a source thereof. An n-channel transistor 113 is connected to a node n5 with a gate thereof, to the node n4 with a drain thereof, and to a ground (reference potential) via a resistance 114 with a source thereof. A p-channel transistor 112 is connected to the node n5 with a gate thereof, to a voltage VII with a source thereof, and to the node n4 with a drain thereof. The voltage VII is for example 1.6 V. A nonconjunction (NAND) circuit 115 is connected to a power supply voltage VII and an input terminal thereof is connected to the node n4 and the line of a signal RSTb, and an output terminal thereof is connected to the node n5. A NOT circuit 116 is connected to the node n5 with an input terminal thereof, and to the line of a signal EFA with an output terminal thereof.

Figure 2:
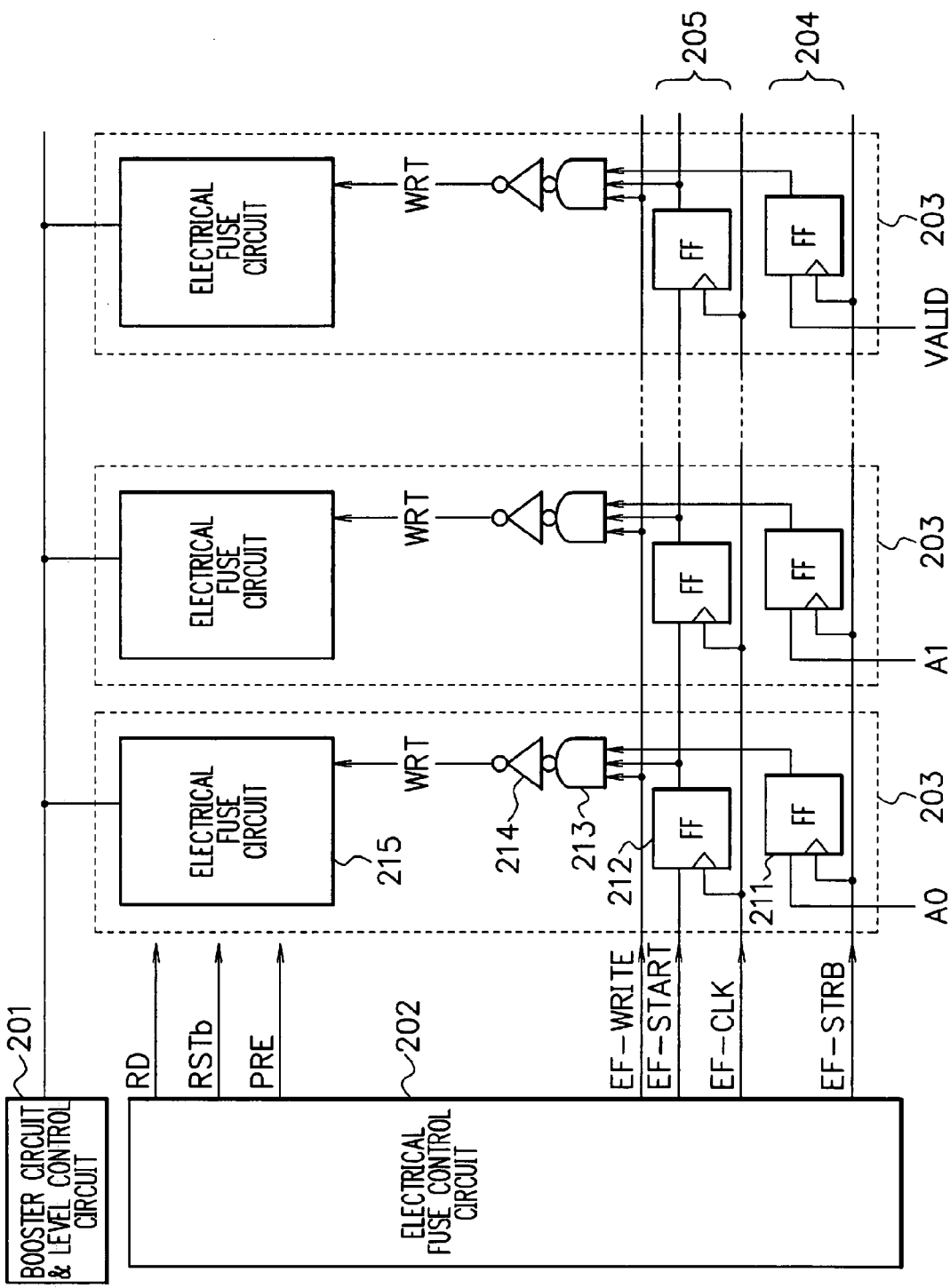
FIG. 2 is a view showing a configuration example of the electrical fuse circuit and a peripheral circuit thereof.
Figure 18:
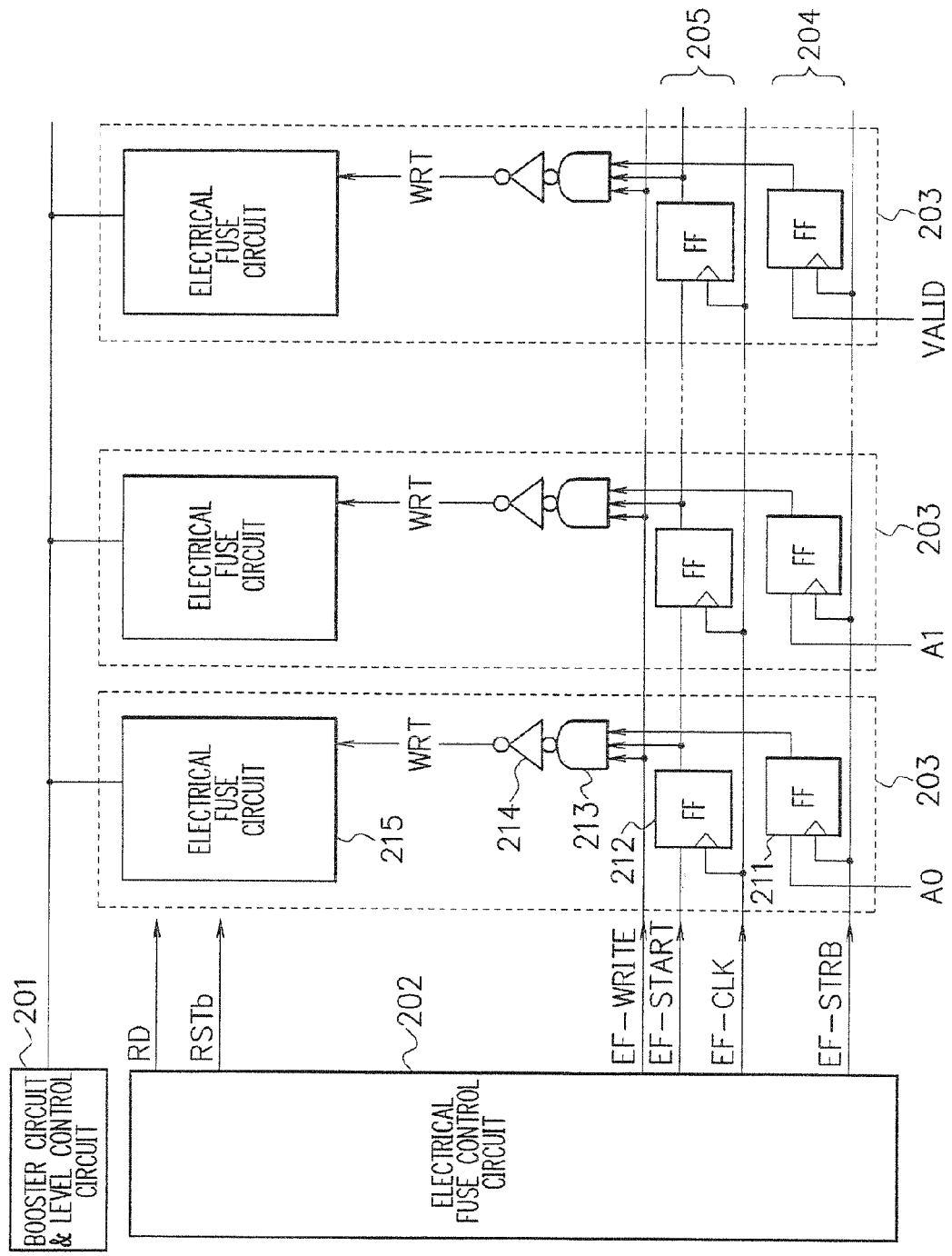
FIG. 18 is a view showing a configuration example of the electrical fuse circuit and the peripheral circuit thereof.

FIG. 2 is a view showing a configuration example of an electrical fuse circuit 215 and a peripheral circuit thereof, having a difference from FIG. 18 in that the electrical fuse control circuit 202 outputs the precharge signal PRE to the electrical fuse circuits 215 in respective unit circuits 203. The electrical fuse circuit 215 corresponds to the electrical fuse circuit 1501 described before. Note that the description of the timing chart showing the write operation into the electrical fuse is the same as in FIG. 19.

The electrical fuse circuit 215 corresponds to the electrical fuse circuit in FIG. 1. A booster circuit & level control circuit 201 boosts the voltage and controls the level to supply the voltage to a plurality of unit circuits 203. An electrical fuse control circuit 202 outputs the signal RD, the signal RSTb, the signal PRE, a signal EF-WRITE, a signal EF-START, a signal EF-CLK, a signal EF-STRB to the plurality of unit circuits 203. Each of the unit circuits 203 includes flip-flops (FFs) 211, 212, a NAND circuit 213, and a NOT circuit 214 and an electrical fuse circuit 215. The flip-flops 211 in the plurality of unit circuits 203 input address signals A0 (zero) to A2 and a valid signal VALID and compose address resistors 204, respectively. For convenience's purpose of description, 3-bit address signals A0 (zero) to A2 are described as an example. The valid signal VALID is a signal indicating whether or not to validate memorized contents of the electrical fuses corresponding to the address signals A0 (zero) to A2. For instance, when no defective memory cell exists and no replacement to the redundant memory cell is required, just make the valid signal VALID to low level. The flip-flops 212 in the plurality of unit circuits 203 compose shift resistors 205. The write signal WRT becomes high level when writing into the fuse circuit 215 and becomes low level when not.

In FIG. 1, when the write signal WRT becomes high level, the transistor 103 is turned on. The high voltage VRR (for example, 8V) is applied to the capacitor 101. The electrical fuse is composed of the capacitor 101, and is in the electrically unconnected state when nothing is done. When the high voltage (for example, 8V) is applied to both the terminals of the capacitor 101, the insulating film of the capacitor 103 is broken, and the electrical fuse capacitor 101 is put into an electrically connected state. These two states are assigned to data 0 (zero) and data 1, respectively. For example, when it is in the electrically unconnected state where the insulating film of the capacitor is not broken, "0 (zero)" is assigned, and when it is in the electrically connected state where the insulating film of the capacitor is broken, "1" is assigned. The capacitor 101 may be used as a nonvolatile ROM.

The high voltage required to perform a breaking operation of the insulating film of the electrical fuse (write operation) is generated by the booster circuit 201 provided in the semiconductor chip. Further, when trying to write into the plurality of capacitors 101 at a time as a write operation, huge current may flow, so that the writing is performed to the capacitors on the one by one basis by providing the shift registers 205, as shown in FIG. 19.

The description will be given of the write operation into the capacitor (electrical fuse) 101. First, the booster circuit 201 boosts the voltage VRR of the common node of the plurality of capacitors 101 to the high voltage (for example, 8V). At this time, the other terminal node n3 of the capacitor 101 is in the floating state, so that the potential of the node n3 increase as well. In this state, the difference between the potentials of both the terminals of the capacitor 101 is still small. The transistor 103 into which the write signal WRT selected by the shift resistor 205 is written is turned on, and the high voltage is applied to between both the terminals of the capacitor 101 using the node n3 as a ground to break the insulating film of the capacitor 101. At this time, in the capacitor 101 corresponding to the unselected write signal WRT, the node n3 is still in the floating state, and the high voltage is not applied to between both the terminals of the unselected capacitor 101.

Figure 20:
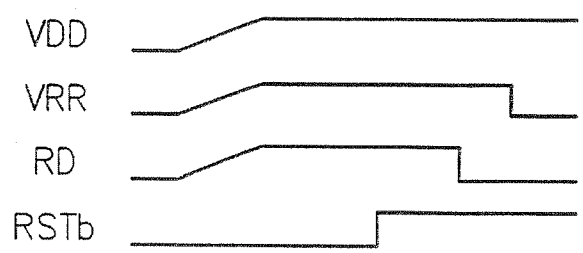
FIG. 20 is a timing chart of the semiconductor memory chip including the electrical fuse circuit when the power supply starts.
Figure 21:
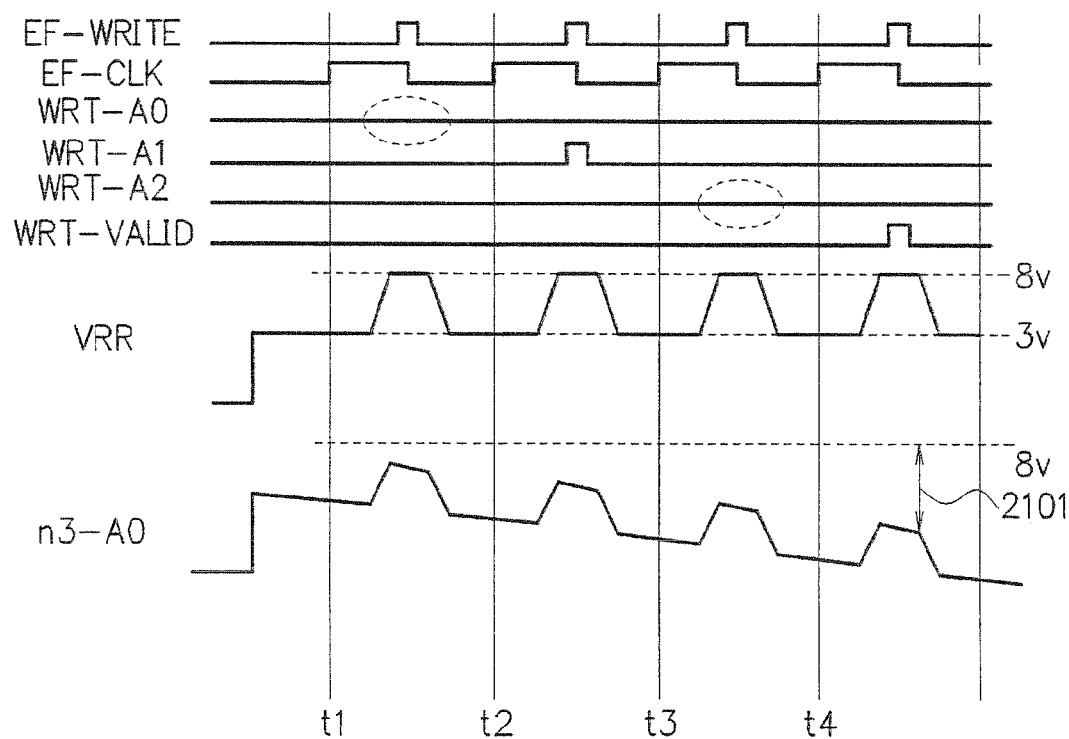
FIG. 21 is a timing chart showing an example writing malfunction into the fuse circuit.

Note that the operation of the read circuit 110 at the time of the power supply start of the semiconductor memory chip including the electrical fuse circuit is the same as that described in FIG. 20 above.

Figure 3:
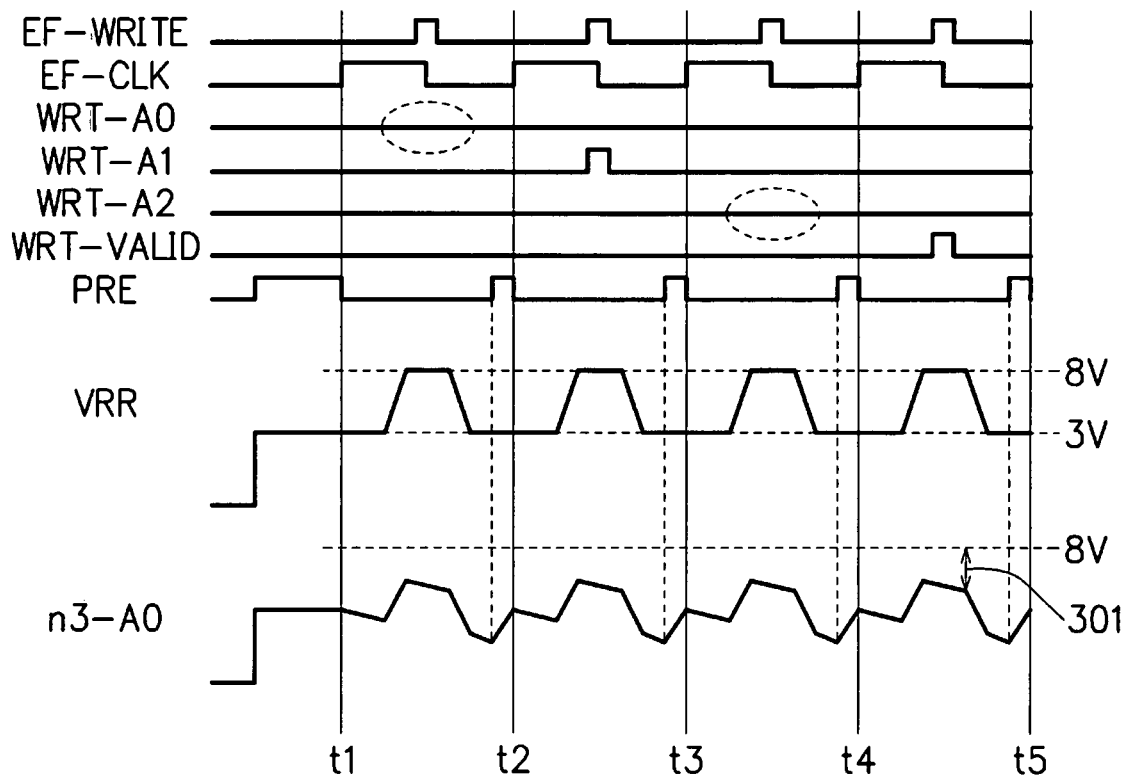
FIG. 3 is a timing chart showing an example write operation into the fuse circuit.
Figure 19:
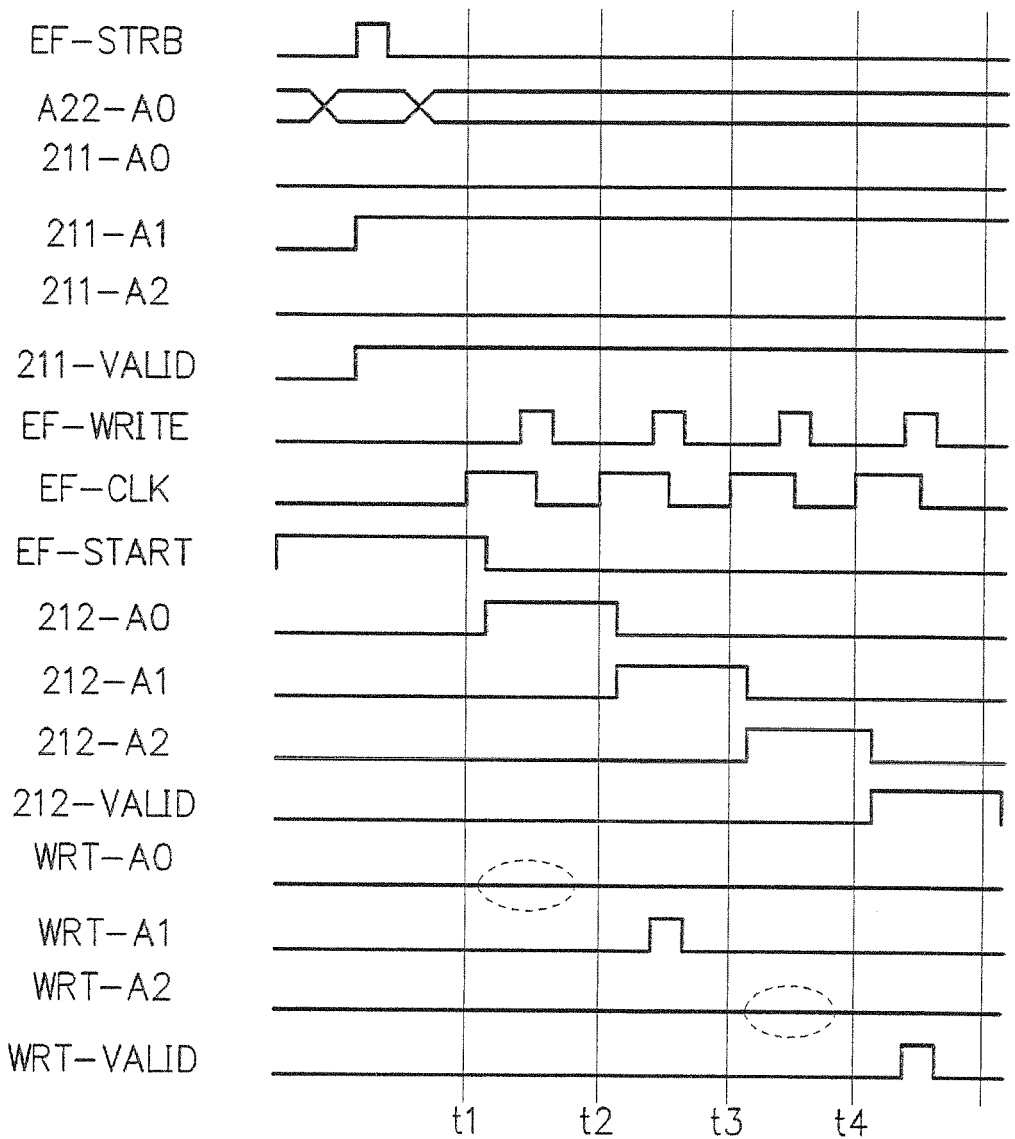
FIG. 19 is a timing chart showing an example write operation into the electrical fuse circuit.

FIG. 3 is a timing chart showing an example write operation of the fuse circuit, which corresponds to FIG. 19. The description of the same signals as of FIG. 19 will therefore be omitted here. At the voltage VRR, a pulse of 8V is generated at the same cycle as of the signal EF-WRITE. The precharge signal PRE has the same cycle as of the clock signal EF-CLK and has a high-level purse regularly just before the respective times t1 to t5. The voltage of the node n3 downs due to a leak or the like as time goes by. When the precharge signal PRE becomes high level, the transistor 121 is turned on, and the voltage VPP is supplied to the node n2. As a result, in the transistor 102, both the gate and source become to have the voltage VPP (for example, 3V), and the node n3 is precharged and increased in potential. The node n3 is precharged regularly by the precharge signal PRE, so that the potential of the node n3 can be prevented from lowering. Based on this, when the write signal WRT is low level, a voltage 301 at both the end of the capacitor 101 can be lowered, so that the insulating film of the capacitor 101 can be prevented from being broken.

Figure 4:
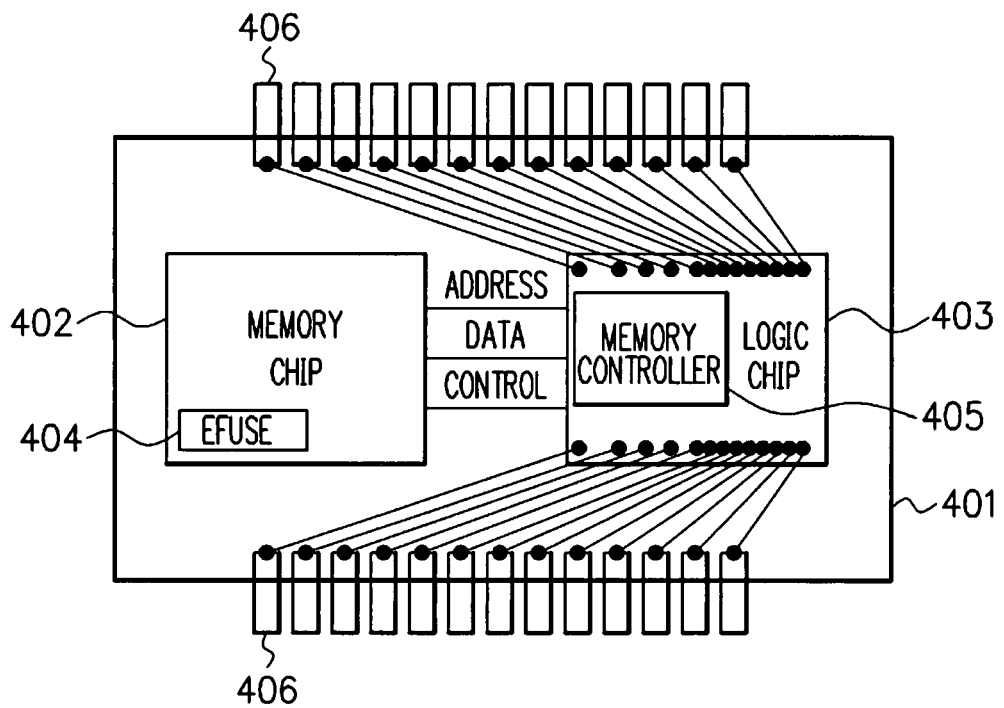
FIG. 4 is a view showing a configuration example of a system in package (SIP)

FIG. 4 is a view showing a configuration example of a system in package (SIP) according to the present embodiment. In a package 401, a memory chip 402 and a logic chip 403 are provided. The memory chip 402 includes an electrical fuse circuit 404. The memory chip 402 corresponds to the semiconductor memory chip in FIG. 15 and the electrical fuse circuit 404 corresponds to the electrical fuse circuit 1501 in FIG. 15. The logic chip 403 includes a memory controller 405 and is connected to external pins 406. The memory controller 405 controls the memory chip 402 via an address line, a data line and a control line.

FIG. 5 is a view showing connection lines between the logic chip 403 and the memory chip 402. The logic chip 403 outputs signals /CE, /OE, /WE, /UB, /LB, and A0 (zero) to A22 to the memory chip 402. Further, the logic chip 403 inputs/outputs the data DQ with respect to the memory chip 402. The signal /CE is a chip enable signal. The signal /OE is an output enable signal. The signal /WE is a write enable signal. The signal /UB is an upper byte enable signal. The signal /LB is a lower byte enable signal. The signals A0 (zero) to A22 are a 23-bit address signal.

FIG. 6 is a view showing example operation codes of the electrical fuse outputted from the memory controller 405 in the logic chip 403 to the memory chip 402.

The code number "0 (zero)" is an address strobe mode entry code, making all the addresses A0 (zero) to A22 be "0 (zero)". This is a code to instruct to start acquiring an address signal into the address resistor 204 in FIG. 2.

The code number "1" is an address strobe mode exit code, making the address signals A1 to A22 be "0 (zero)" and making the address signal A0 (zero) be "1". This is a code to instruct to end the acquisition of the address signal into the address resistor 204 in FIG. 2.

The code number "2" is an electrical fuse write mode entry code, making the address signals A0 (zero) and the address signals A2 to A22 be "0 (zero)" and making the address signal A1 be "1". The code is a code to instruct to start writing into the electrical fuse at and after the time t1 in FIG. 19.

The code number "3" is an electrical fuse write mode exit code, making the address signals A2 to A22 be "0 (zero)" and making the address signals A0 (zero) and A1 be "1". This code is a code to instruct to end writing into the electrical fuse.

Figure 7:
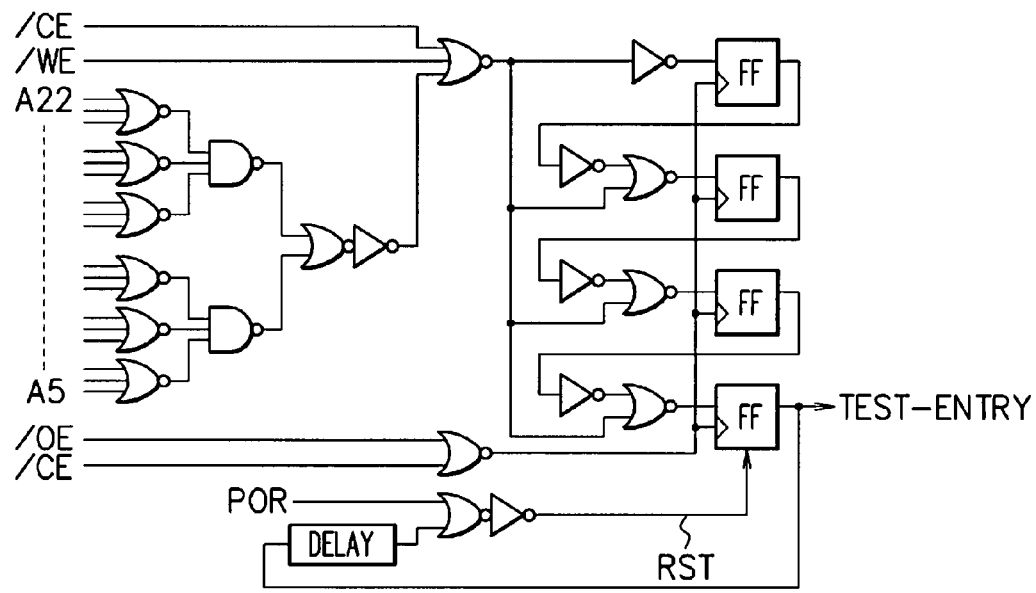
FIG. 7 is a circuit diagram showing a configuration example of the electrical fuse control circuit.
Figure 8:
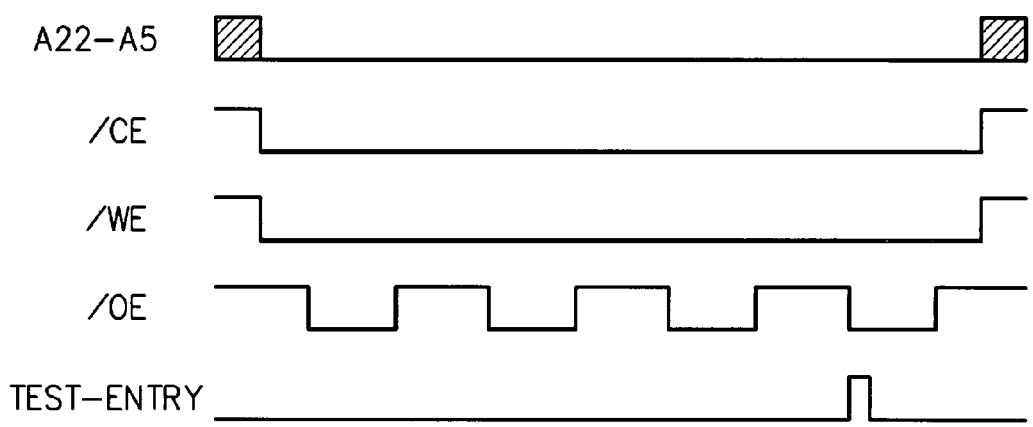
FIG. 8 is a timing chart showing an example operation of the circuit in FIG. 7.

FIG. 7 is a circuit diagram showing a configuration example of the electrical fuse control circuit 202 (FIG. 2) into which the electrical fuse operation codes in FIG. 6 are inputted, and FIG. 8 is a timing chart showing an example operation thereof. The electrical fuse control circuit 202 is provided in the memory chip 402. In order to input the electrical fuse operation codes, the address signals A5 to A22 are put into "0 (zero)", the chip enable signal /CE is put into low level, the write enable signal /WE is put into low level, and four pulses are inputted as an output enable signal /OW. A power only set signal POR is a signal having a high-level pulse at the power supply start. With the power only set signal POR, a reset signal RST resets four flip-flops (FFs). With the four pulses of the output enable signal /OE, the flip-flop at a final stage outputs a high-level pulse as a signal TEST-ENTRY.

Figure 9:
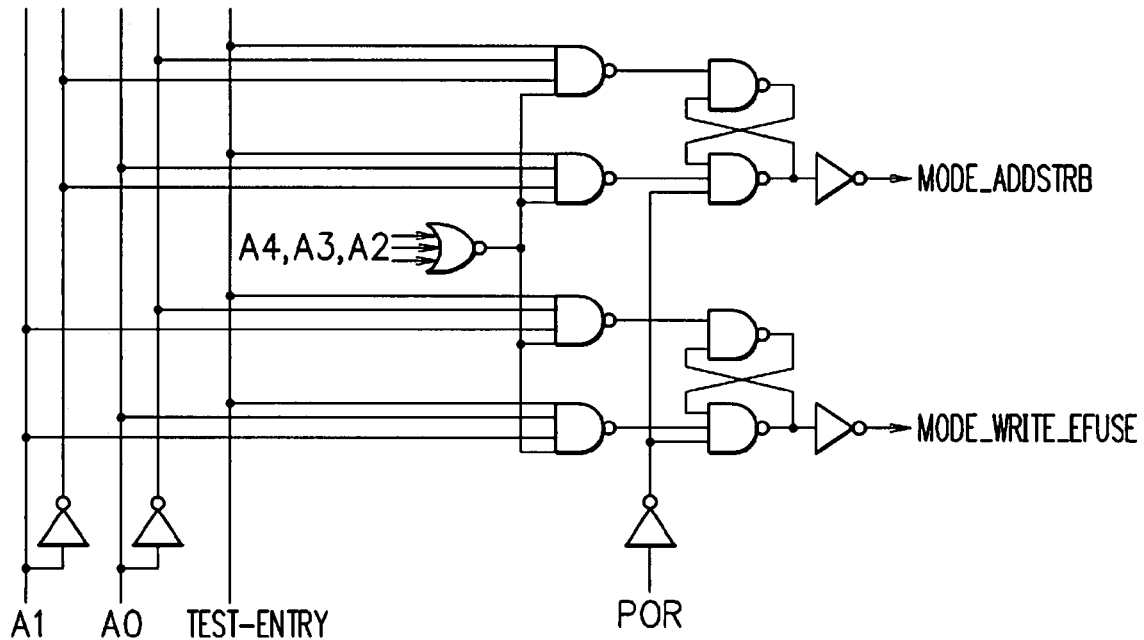
FIG. 9 is a view showing a configuration example of the electrical fuse control circuit connected to FIG. 7.

FIG. 9 is a circuit diagram showing a configuration example of the electrical fuse control circuit 202 (FIG. 2) connected to FIG. 7. When the signal TEST-ENTRY becomes high level and the address signals A2 to A4 become "0 (zero)", it operates as follows. When the address signals A0 (zero) and A1 are "0 (zero)", which corresponds to the code number "0 (zero)" in FIG. 6, a signal MODE_ADDSTRB becomes high level. When the address signal A0 (zero) is "1" and the address signal A1 is "0 (zero)", which corresponds to the code number "1" in FIG. 6, the signal MODE_ADDSTRB becomes low level. When the address signal A0 (zero) is "0 (zero)" and the address signal A1 is "1", which corresponds to the code number "2" in FIG. 6, a signal MODE_WRITE_E-FUSE becomes high level. When the address signals A0 (zero) and A1 are "1", which corresponds to the code number "3" in FIG. 6, the signal MODE_WRITE_EFUSE becomes low level. Note that, with the power only set signal POR, the signals MODE_ADDSTRB, MODE_WRITE_EFUSE are reset to low level.

Figure 10:
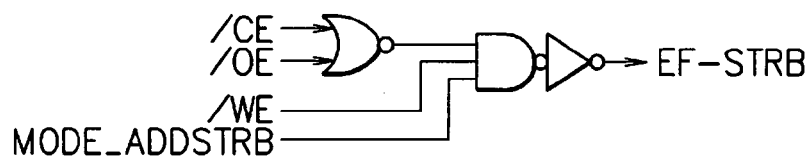
FIG. 10 is a view showing a configuration example of the electrical fuse control circuit connected to FIG. 9.
Figure 11:
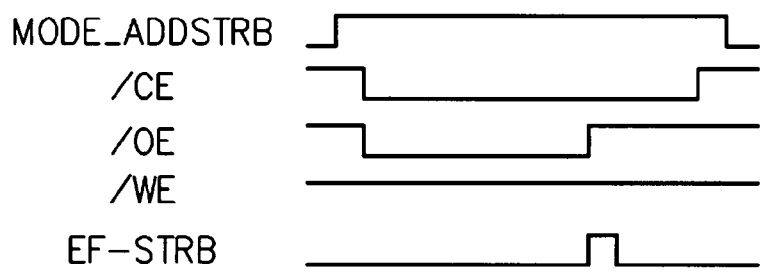
FIG. 11 is a timing chart showing an example operation of the circuit in FIG. 10.

FIG. 10 is a circuit diagram showing a configuration example of the electrical fuse control circuit 202 (FIG. 2) connected to FIG. 9, and FIG. 11 is a timing chart showing an example operation thereof. The signal MODE_ADDSTRB is inputted from the circuit in FIG. 9. When the signal MODE_ADDSTRB is high level, the chip enable signal /CE is put into low level, the write enable signal /WE is put into high level, and the output enable signal /OE is put into high level from low level, so that a high-level pulse is generated in the signal EF-STRB. The signal EF-STRB is the signal EF-STRB in FIG. 2 and FIG. 19.

FIG. 12 is a circuit diagram showing a configuration example of the electrical fuse control circuit 202 (FIG. 2) connected to FIG. 9, and FIG. 13 is a timing chart showing an example operation thereof. The signal MODE_WRITE_E-FUSE is inputted from the circuit in FIG. 9. When the signal MODE_WRITE_EFUSE is high level, a pulse having a constant cycle is inputted as an upper byte enable signal /UB. Nodes Q0 (zero) and Q1 show voltages of output nodes of two flip-flops, respectively. The clock signal EF-CLK, the write signal EF-WRITE and the precharge signal PRE are generated by this circuit. These clock signal EF-CLK, the write signal EF-WRITE and the precharge signal PRE are the clock signal EF-CLK, the write signal EF-WRITE and the precharge signal PRE in FIGS. 2, 3 and 9, respectively.

Figure 14:
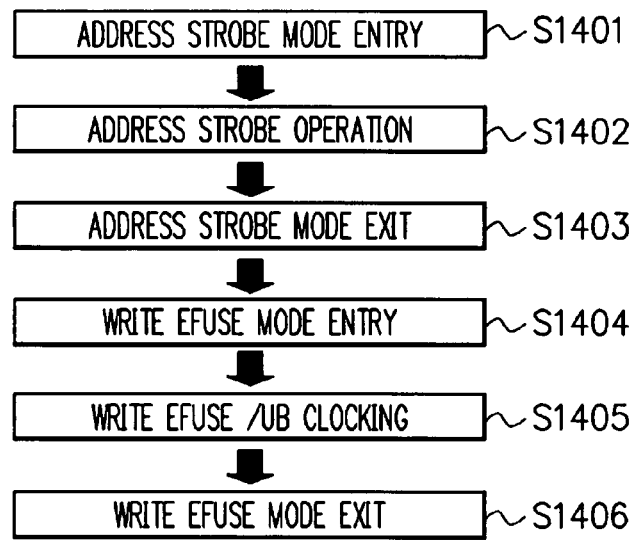
FIG. 14 is a flowchart showing such an example process of the memory controller in the logic chip as writes into the electrical fuse in the memory chip.

FIG. 14 is a flowchart showing a process example when the memory controller 405 in the logic chip 403 in FIG. 4 writes into the electrical fuse circuit 404 in the memory chip 402.

In Step S1401, the memory controller 405 instructs the address strobe mode entry of the code number "0 (zero)" in FIG. 6 to the electrical fuse control circuit 202 in the memory chip 402. Specifically, the memory controller 405 outputs the signals shown in FIG. 8 to the electrical fuse control circuit 202.

Substantially, in Step S1402, the memory controller 405 outputs the signals shown in FIG. 11 to the electrical fuse control circuit 202. Then, the electrical fuse control circuit 202 acquires the address signal and the valid signal into the address resistor 204.

Subsequently, in Step S1403, the memory controller 405 instructs the address strobe mode exit of the code number "1" in FIG. 6 to the electrical fuse control circuit 202 in the memory chip 402. Specifically, the memory controller 405 outputs the signals shown in FIG. 8 to the electrical fuse control circuit 202. With this, the electrical fuse control circuit 202 ends the above-described acquisition process.

Subsequently, in Step S1404, the memory controller 405 instructs the electrical fuse write mode entry of the code number "2" in FIG. 6 to the electrical fuse control circuit 202 in the memory chip 402. Specifically, the memory controller 405 outputs the signals shown in FIG. 8 to the electrical fuse control circuit 202.

Subsequently, in Step S1405, the memory controller 405 clocks to output the byte enable signal /UB shown in FIG. 13 to the electrical fuse control circuit 202. Then, the electrical fuse control circuit 202 performs the write process into the electrical fuse circuit 215.

Subsequently, in Step S1406, the memory controller 405 instructs the electrical fuse write mode exit of the code number "3" in FIG. 6 to the electrical fuse control circuit 202 in the memory chip 402. Specifically, the memory controller 405 outputs the signals shown in FIG. 8 to the electrical fuse control circuit 202. With this, the electrical fuse control circuit 202 ends the above-described write process.

As described above, according to the present embodiment, by precharging the node n3 of the capacitor 101 regularly, the potential down of the node n3 can be prevented. Backed by this, when no write instruction into the capacitor 101 is made, it is possible to prevent the capacitor from an accidental writing caused by the high voltage application to both the end thereof. Among others, it is possible to increase the reliability in the semiconductor integrated circuit mounting many electrical fuses thereon and the electronic part packaging it therein.

The capacitor 101 composes the electrical fuse. The write circuit breaks the insulating film of the capacitor 101 by applying voltage to between both the terminals of the capacitor 101 in accordance with the write signal WRT.

As shown in FIG. 1 and FIG. 2, there are provided the plurality of electrical fuse circuits 215 each including the group of the capacitor 101 and the write circuit. As shown in FIGS. 3 and 19, the write circuits in the respective groups apply the voltage to the corresponding capacitor 101 in accordance with the write signal WRT, respectively, at mutually different timings. The write circuit applies the first potential VRR to the first terminal of the capacitor 101 and applies the second potential (ground) being lower than the first potential VRR to the second terminal of the capacitor 101, in accordance with the write signal WRT, to thereby break the insulating film of the capacitor 101. Further, otherwise, the write circuit applies the second potential (ground) to the second terminal of the capacitor 101 in accordance with the write signal WRT to thereby put the second terminal of the capacitor 101 into the floating state. The write circuit includes the field-effect transistor 103, which is connected to the write signal WRT with the gate thereof, to the second terminal of the capacitor 101 via the field-effect transistor 102 with the drain thereof, and to the second potential (ground) with the source thereof.

The precharge circuit precharges with respect to the terminal of the capacitor 101. The precharge circuit includes the field-effect transistor 121, which is connected to the precharge signal PRE with the gate thereof, to the terminal of the capacitor 101 via the field-effect transistor 102 with the drain thereof, and to the precharge potential VPP with the source thereof.

As shown in FIG. 15, the memory device includes the electrical fuse circuit 1501, the normal memory cell array 1503 including the plurality of memory cells, and the redundant memory cell array 1504 including the memory cell to replace the memory cell in the normal memory cell array 1503 therewith. The capacitor 101 (FIG. 1) in the electrical fuse circuit 1501 memorizes the address of the memory cell to be replaced in the normal memory cell array 1503. The electrical fuse circuit 1501, the normal memory cell array 1503 and the redundant memory cell array 1504 are provided in the memory chip 402 (FIG. 4). As shown in FIG. 4, the memory chip 402 is packaged in the package 401. The memory device further includes the memory controller 405 controlling the operation of the write circuit 103 with respect to the semiconductor memory chip 402.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

With the precharge, the writing malfunction into the electrical fuse can be prevented.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An electrical fuse circuit comprising:
   a plurality of groups, each of the groups including:
   a capacitor composing an electrical fuse;
   a write circuit breaking an insulating film of said capacitor by applying a voltage across both terminals of said capacitor in accordance with one of a plurality of write signals; and
   a precharge circuit precharging with respect to the terminal of said capacitor,
   wherein the precharge circuit is coupled to a low-voltage-side terminal of the capacitor,
   wherein each of the plurality of write signals is supplied to the corresponding write circuit of each of the plurality of groups at different timings with one another and during a period of time when a precharge operation is not being performed, and
   wherein the precharge operation is performed during a period of time when the write signals are inactive.

2. The electrical fuse circuit according to claim 1 wherein said write circuits in the respective groups apply voltage to said capacitors in accordance with the write signal, respectively, at mutually different timings.

3. The electrical fuse circuit according to claim 1, wherein, otherwise, said precharge circuit applies a precharge potential to a second terminal of said capacitor in accordance with a precharge signal to put the second terminal of said capacitor into a floating state.

4. A memory device comprising:
an electrical fuse circuit described in claim 1;
a normal memory cell array including a plurality of memory cells; and
a redundant memory cell array including a memory cell to replace the memory cell in said normal cell array;
wherein a capacitor in said electrical fuse circuit memorizes an address of the memory cell in said normal memory cell array to be replaced.

5. The electrical fuse circuit according to claim 2,
wherein the precharge operation is performed to the terminal of said capacitor during a period of time when said write circuits in the respective groups apply voltage to said capacitors in accordance with the write signal, respectively, at mutually different timings.

6. The electrical fuse circuit according to claim 3,
wherein said precharge circuit includes a first field-effect transistor connected to the terminal of said capacitor with a drain thereof and connected to the precharge potential with a source thereof.

7. The electrical fuse circuit according to claim 3,
wherein said write circuit breaks the insulating film of said capacitor by applies a first potential to a first terminal of said capacitor and applying a second potential having a lower potential than that of the first potential to a second terminal of said capacitor, in accordance with the write signal.

8. The electrical fuse circuit according to claim 3, further comprising a second field-effect transistor connected to between the drain of the first field-effect transistor and the second terminal of said capacitor.

9. The electrical fuse circuit according to claim 6, further comprising a second field-effect transistor connected to between the drain of the first field-effect transistor and the terminal of said capacitor.

10. The electrical fuse circuit according to claim 7,
wherein, otherwise, said write circuit applies the second potential to the second terminal of said capacitor in accordance with the write sign alto put the second terminal of said capacitor into a floating state.

11. The electrical fuse circuit according to claim 10,
wherein said write circuit includes a first field-effect transistor connected to the write signal with a gate thereof and connected to a second terminal of said capacitor with a source thereof.

12. The electrical fuse circuit according to claim 8,
wherein said precharge circuit includes a third field-effect transistor connected to the second terminal of said capacitor via said second field-effect transistor with a drain thereof and to a precharge potential with a source thereof.

13. An electronic part comprising a memory device described in claim 4, said memory device including an electrical fuse circuit, a normal memory cell array and a redundant memory cell array and a semiconductor memory chip provided with the electrical fuse circuit, the normal memory cell array and the redundant memory cell array therein,
wherein the semiconductor memory chip is mounted in a package.

14. The electronic part according to claim 13,
wherein a chip having a memory controller controlling an operation of a write circuit with respect to the semiconductor memory chip is mounted in the same package as of said semiconductor memory device.

* * * * *